(12) United States Patent
Missing et al.

(10) Patent No.: US 11,920,613 B2
(45) Date of Patent: Mar. 5, 2024

(54) TANK, LIQUID CIRCULATION SYSTEM AND OPERATING METHOD

(71) Applicant: Hitachi Energy Ltd, Zürich (CH)

(72) Inventors: Kim Missing, Vaasa (FI); Jouni Ikaheimo, Kurikka (FI); Tero Kansakangas, Vaasa (FI); Alex Michael Danci, Tölby (FI)

(73) Assignee: Hitachi Energy Ltd, Zürich (CH)

( * ) Notice: Subject to any disclaimer, the term of this patent is extended or adjusted under 35 U.S.C. 154(b) by 0 days.

(21) Appl. No.: 18/253,659

(22) PCT Filed: Sep. 9, 2021

(86) PCT No.: PCT/EP2021/074820
§ 371 (c)(1),
(2) Date: May 19, 2023

(87) PCT Pub. No.: WO2022/106089
PCT Pub. Date: May 27, 2022

(65) Prior Publication Data
US 2023/0323881 A1 Oct. 12, 2023

(30) Foreign Application Priority Data
Nov. 23, 2020 (EP) .................................... 20209190

(51) Int. Cl.
*F04D 3/02* (2006.01)
*F04D 13/06* (2006.01)
(Continued)

(52) U.S. Cl.
CPC ............... *F04D 3/02* (2013.01); *F04D 13/06* (2013.01); *F28D 7/026* (2013.01); *F28F 13/12* (2013.01);
(Continued)

(58) Field of Classification Search
CPC .. F04D 3/02; F04D 13/06; F28D 7/026; F28F 13/12; F28F 21/062; H02K 44/06;
(Continued)

(56) References Cited

U.S. PATENT DOCUMENTS 1,140,843 A * 5/1915 Nichols .................... H01F 27/12
165/47
2,275,428 A * 3/1942 Haldeman .............. B01D 35/26
261/36.1
(Continued)

FOREIGN PATENT DOCUMENTS

CN 203573777 U 4/2014
EP 2487327 A1 8/2012
(Continued)

OTHER PUBLICATIONS

International Search Report and Written Opinion of the International Searching Authority, PCT/EP2021/074820, dated Nov. 26, 2021, 15 pages.
(Continued)

*Primary Examiner* — Peter J Bertheaud
(74) *Attorney, Agent, or Firm* — Sage Patent Group

(57) ABSTRACT

In at least one embodiment, the liquid circulation system comprises
  a rotor located within a tank,
  a stator having a plurality of coils outside the tank, and
  an exterior tank wall that is non-magnetic and that is located next to the rotor and between the rotor and the stator,
wherein
  an axis (R) of rotation of the rotor is in parallel with the exterior tank wall,
  the coils of the stator are arranged along the axis (R) of rotation of the rotor so that the rotor is configured to be rotated by the stator in a touchless manner through the
(Continued)

Figure 1:
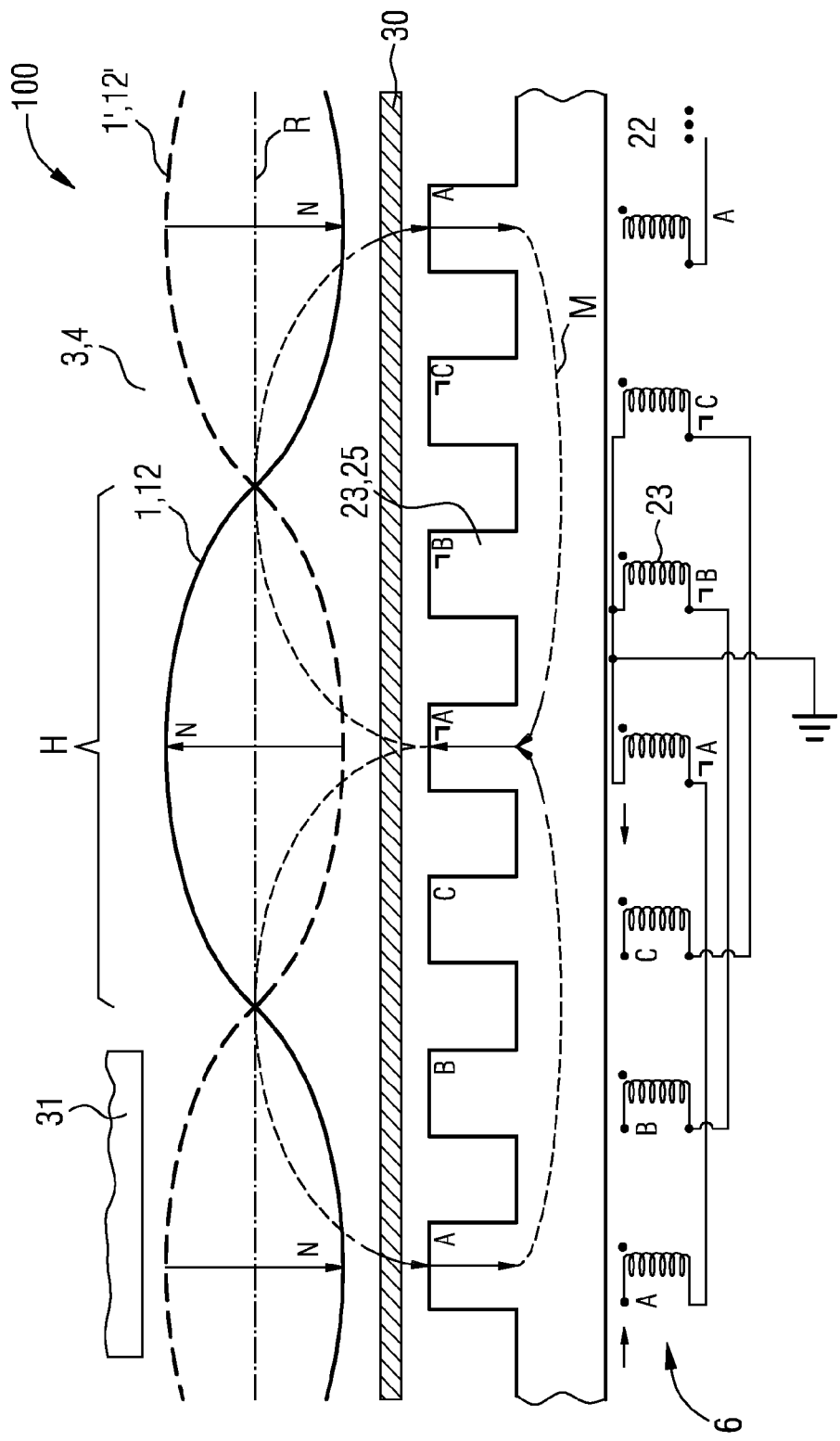

exterior tank wall by means of a varying electromagnetic field driven by the stator to circulate a liquid within the tank.

15 Claims, 5 Drawing Sheets

(51) Int. Cl.
    *F28D 7/02*     (2006.01)
    *F28F 13/12*     (2006.01)
    *F28F 21/06*     (2006.01)
    *H02K 44/06*     (2006.01)
    *H05K 7/14*     (2006.01)
    *H05K 7/20*     (2006.01)

(52) U.S. Cl.
    CPC ........... *F28F 21/062* (2013.01); *H02K 44/06* (2013.01); *H05K 7/14337* (2022.08); *H05K 7/20236* (2013.01); *H05K 7/20272* (2013.01); *H05K 7/20872* (2013.01); *H05K 7/20927* (2013.01)

(58) Field of Classification Search
    CPC ........... H05K 7/14337; H05K 7/20236; H05K 7/20272; H05K 7/20872; H05K 7/20927
    See application file for complete search history.

(56) References Cited

U.S. PATENT DOCUMENTS

| | | | | |
|---|---|---|---|---|
| 2,362,922 A * | 11/1944 | Palm | ........................ | F16N 13/20 |
| | | | | 415/72 |
| 3,719,436 A * | 3/1973 | McFarlin | ................. | H02K 7/14 |
| | | | | 417/356 |
| 5,324,177 A * | 6/1994 | Golding | .............. | A61M 60/824 |
| | | | | 417/423.1 |
| 6,254,359 B1 | 7/2001 | Aber | | |
| 7,226,277 B2 * | 6/2007 | Dooley | ............... | F04D 13/0606 |
| | | | | 415/72 |
| 10,390,459 B2 * | 8/2019 | Gradinger | ............ | H05K 5/0017 |
| 11,419,241 B2 * | 8/2022 | Laneryd | .................... | F28F 1/40 |
| 2006/0122456 A1 | 6/2006 | LaRose et al. | | |
| 2011/0138530 A1 | 6/2011 | Johnson | | |
| 2013/0039785 A1 | 2/2013 | Davidson et al. | | |

FOREIGN PATENT DOCUMENTS

| | | |
|---|---|---|
| EP | 2928275 A1 | 10/2015 |
| JP | S49-048203 U | 4/1974 |
| JP | S50-034101 U | 4/1975 |
| JP | H06-087690 U | 12/1994 |
| JP | H07-180689 A | 7/1995 |
| JP | 2011252436 A | 12/2011 |
| WO | 2014036006 A2 | 3/2014 |

OTHER PUBLICATIONS

Extended European Search Report, European Patent Application No. EP20209190.6, dated Apr. 30, 2021, 10 pages.
Written Opinion of the International Preliminary Examining Authority, PCT/EP2021/074820, dated Oct. 24, 2022, 6 pages.
International Preliminary Report on Patentability, PCT/EP2021/074820, dated Feb. 16, 2023, 17 pages.
Office Action, Japanese Patent Application No. 2023-530851, dated Dec. 12, 2023, 5 pages.

* cited by examiner

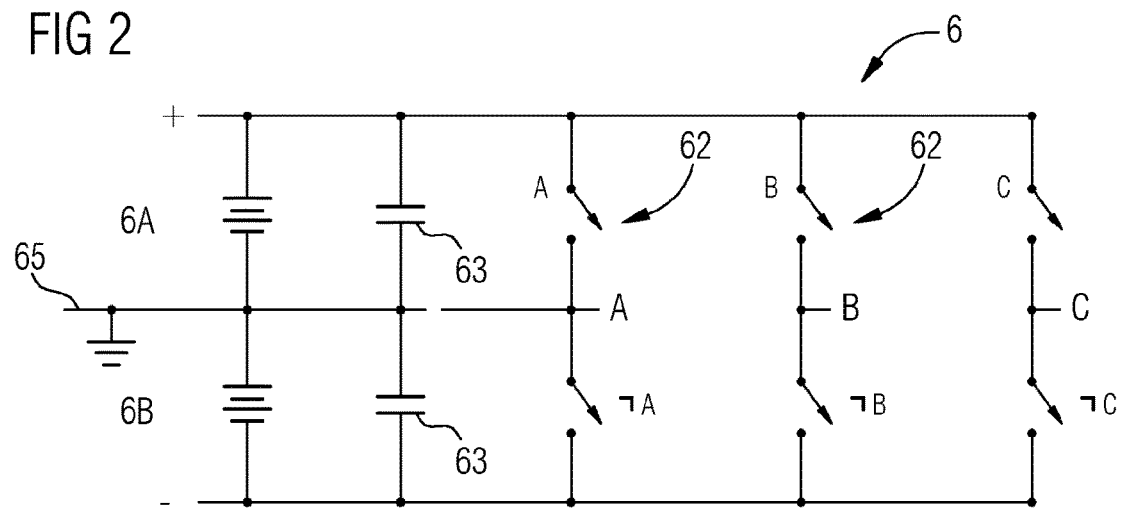
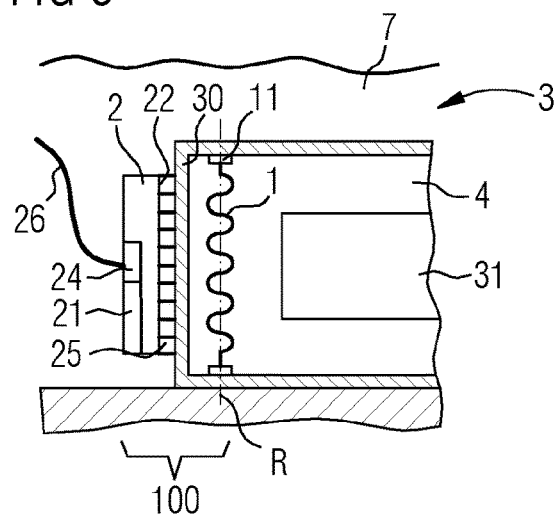
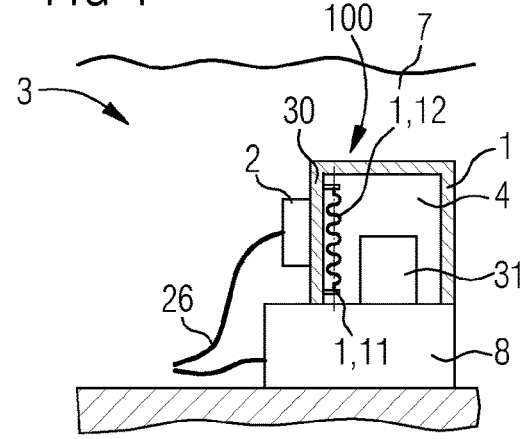
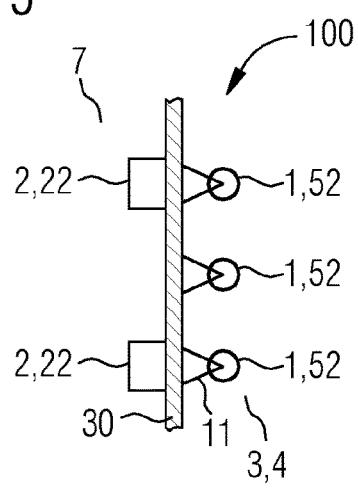
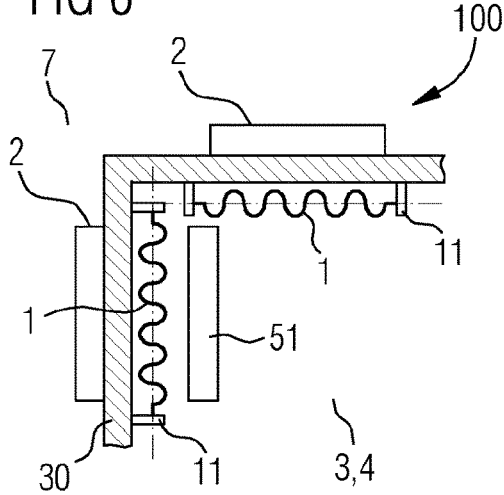

TANK, LIQUID CIRCULATION SYSTEM AND OPERATING METHOD

CROSS REFERENCE TO RELATED APPLICATIONS

This application is a 35 U.S.C. § 371 national stage application of PCT International Application No. PCT/EP2021/074820 filed on Sep. 9, 2021, which in turn claims foreign priority to European Patent Application No. 20209190.6, filed on Nov. 23, 2020, the disclosures and content of which are incorporated by reference herein in their entirety.

DESCRIPTION

A tank and a liquid circulation system are provided. Further, an operating method for such a liquid circulation system is also provided.

Document WO 2014/036006 A2 refers to an electromagnetic circulation pump.

An object to be achieved is to provide a liquid circulation system to circulate a liquid in a tank wherein the liquid circulation system is configured in a low-maintenance manner.

This object is achieved, inter alia, by a tank and a liquid circulation system as well as an operating method for the liquid circulation system as specified in the independent claims. Example further developments constitute the subject matter of the dependent claims.

For example, the liquid circulation system is an apparatus comprising a rotor in a tank, and the rotor is driven from outside the tank by a stator through a non-magnetic exterior tank wall. Thus, inside the tank there is only the rotor to move the liquid, but more maintenance intensive components like the stator can be still located outside the tank.

In at least one embodiment, the tank comprises one rotor or a plurality of rotors located within the tank. An exterior tank wall of the tank is non-magnetic and is located next to the rotor. An axis of rotation of the rotor is in parallel with the exterior tank wall next to the rotor. The rotor is configured to be rotated by a varying electromagnetic field in a touchless manner through the exterior tank wall to circulate a liquid within the tank.

The term 'in parallel' means, for example, that an angle between the respective components that are in parallel with each other is at most 20° or at most 10° or at most 5° or at most 1°. This means that 'in parallel' can refer to the arrangement of the respective components considering mounting tolerances.

In at least one embodiment, the power unit comprises one stator or a plurality of stators, the stator including, or each one of the stators including, a plurality of coils.

For simplicity, in the following in most cases only one rotor and/or only one stator is mentioned. The respective properties may apply to all the rotors and/or stators if there is a plurality of rotors and/or stators.

Moreover, the power unit can comprise a control unit to control an electric current through the coils. Further, the power unit may comprise an electric terminal box to be electrically connected. The power unit is configured to be attached from outside a tank to an exterior tank wall of the tank. The coils of the stator, or at least most of the coils, are arranged along a line, for example, along a straight line, like an axis of rotation of a rotor the stator is configured for. The stator is also configured to rotate the rotor in a touchless manner by driving a varying electromagnetic field through the exterior tank wall of the tank to circulate a liquid within the tank.

Further, in at least one embodiment the liquid circulation system comprises at least one rotor located within a tank, and at least one stator having a plurality of coils, and the at least one stator is located outside the tank. An exterior tank wall of the tank is non-magnetic and is located next to the at least one rotor and next to the at least one stator between the at least one rotor and the at least one stator.

An axis of rotation of the at least one rotor is in parallel with the exterior tank wall next to the rotor. Further, the axis of rotation can be in parallel and/or congruent with the straight line along the coils can be arranged, for example, seen in top view of the tank wall next to the stator. Otherwise, the axis of rotation can be oriented transversely, for example, perpendicularly, with the straight line along the coils can be arranged.

The coils of the at least one stator are arranged along the at least one axis of rotation of the at least one rotor so that the at least one rotor is configured to be rotated by the at least one stator in a touchless manner through the exterior tank wall by means of a varying electromagnetic field driven by the at least one stator, so that the at least one rotor can circulate a liquid within the tank.

Hence, for example, an electrically driven sealed tank liquid circulation apparatus for sub-sea transformers is provided.

For example, the rotor is a device for stirring and/or circulating a liquid inside a sealed tank that does not require holes through the tank wall or physical attachments to the tank wall. The rotor as the stirring device may be a ferritic strip twisted into a helical geometry about its long axis. A stirring direction may be in parallel with the tank wall, and may be in parallel with or transverse, like perpendicular, to the line the coils are arranged along.

The helical ferritic strip may be positioned inside the liquid tank serves as both the stirring element and the rotor of a switched reluctance motor, for example. The rotor is caused to rotate by a traveling magnetic wave generated by a multi-phase stator positioned parallel to it outside the tank. For example, the stator creates the traveling magnetic wave by means of electronic commutation.

Thus, the need for enhanced oil circulation in sub-sea transformers is addressed. With the tank, the power unit and the liquid circulation system described here the circulating flow of insulating oil within the transformer, for example, is increased to enhance the heat transfer from the active part of the transformer to the sea water in which the transformer is operating. Ideally, the use of the rotor does not create any additional holes in the tank for pipes, mechanical or electrical feedthroughs.

In the liquid circulation system described here, a radial magnetic flux is used where the axis of rotation is parallel to the exterior tank wall. The rotor of the present system serves as both the rotor and impeller of the stirring device the liquid circulation system can be.

According to at least one embodiment, the liquid circulation system comprises the tank and/or the power unit described above. Features of the tank and of the power unit are therefore also disclosed for the liquid circulation system and vice versa.

According to at least one embodiment, the power unit or the stator is mounted from outside the tank onto the exterior tank wall next to the rotor. For example, the stator and the assigned rotor are placed on two opposite sides of the exterior tank wall in a congruent manner.

According to at least one embodiment, the tank is filled with the liquid. For example, the tank is completely filled with the liquid and with one electric component or a plurality of electric components located in the tank. Thus, there may be no voids or bubbles or air pockets in the tank that could be compressed when the tank is sunk into the sea. The same can apply to the power unit.

According to at least one embodiment, the liquid is transformer oil. As an alternative, other electrically insulating liquids having a low compressibility, like silicone oils, may be used. If the power unit is filled with the liquid, the same applies to the power unit.

According to at least one embodiment, the power unit is reversibly attachable to the exterior tank wall. Hence, the power unit may be replaced by a respective spare part, and no work needs to be done inside the tank.

According to at least one embodiment, the tank accommodates the at least one electric component. The component, or at least some of the components, is/are selected from the following group: a transformer, a drive, a shunt reactor, for example.

Hence, the rotor, the stator, the power unit and/or the liquid circulation system may be applied, for example, to
 single phase distribution transformers,
 medium distribution transformers configured for 315 kVA up to 2499 kVA,
 low-voltage variable speed drive transformers configured for a secondary voltage of at most 1.0 kV,
 industrial transformers,
 shell transformers,
 OLTC, vacuum or conventional,
 large-to-medium distribution transformers configured for more than 2499 kVA,
 small distribution transformers configured for up to 315 kVA,
 small power transformers,
 high-voltage direct current transformers,
 drives like variable speed drives, and/or
 reactors like shunt reactors,
 in batch or continuous chemical processing,
 waste treatment,
 fermentation, or
 food and beverage processing.

Hence, the rotor, the stator, the power unit and/or the liquid circulation system may be applied, for example, where mixing of at least one liquid is required in a pressurized or evacuated sealed tank.

According to at least one embodiment, the tank, the power unit and/or the liquid circulation system are configured as a sub-sea component. For example, the tank, the power unit and/or the liquid circulation system are configured to be put into saltwater up to a depth of 1 km or 2 km or 3 km or 5 km. Hence, the tank, the power unit and/or the liquid circulation system are configured to withstand high external pressure.

According to at least one embodiment, the exterior tank wall is made of steel, for example, of non-magnetic austenitic stainless steel. For example, the exterior tank wall, in the area between the stator and the rotor, has a thickness of at least 0.5 cm or of at least 0.8 cm. Alternatively or additionally, said thickness is at most 1.5 cm or at most 3 cm.

According to at least one embodiment, the rotor comprises one paddle portion or a plurality of paddle portions. The at least one paddle portion is configured to rotate around the axis of rotation. For example, the at least one paddle portion of the rotor is a helix or a screw, like an Archimedean screw, or an impeller. Otherwise, the paddle portion may have the shape of a fan or a rotor blade.

According to at least one embodiment, the paddle portion is of one piece. Otherwise, the paddle portion can be of multi-piece fashion and/or can comprise different materials. For example, the paddle portion comprises at least one ferritic material configured to be in magnetic interaction with the stator, and at least one further material like a plastic that is non-ferritic and that is configured to stir the liquid.

Hence, the rotor may comprise a section optimized for driving the rotor and a section optimized for stirring the liquid.

According to at least one embodiment, the paddle portion is located distant from the exterior tank wall in its intended use. For example, a distance between the paddle portion and the exterior tank wall next to the rotor is at least 1 mm or at least 0.5 cm. Alternatively or additionally, said distance is at most 1 cm or is at most 5 cm or is at most 0.1 m. For example, the paddle portion is located as close to the exterior tank wall as possible without scratching and/or touching the exterior tank wall.

According to at least one embodiment, the rotor comprises ends. The ends of the rotor bear the paddle portion. For example, the ends are supported in a fixed manner in the tank so that the ends can have a fixed location relative to the exterior tank wall next to the rotor. The ends may also be referred to as support, mount or bearing of the paddle portion. The ends may be attached directly to the exterior tank wall or otherwise to another interior component of the tank.

According to at least one embodiment, a length of the paddle portion along the axis of rotation is at least 1.5 periods or at least 3 periods or at least 5 periods of the paddle portion. For example, the term 'period' refers to one winding or to one 360° turn of the paddle portion, for example, of the helix or of the screw. Alternatively or additionally, said length is at most 50 periods or at most 15 periods or at most 10 periods. For example, the length is limited by the flexing of the paddle axel, which can be made of at least one stiffer material such as fiberglass or graphite fiber reinforced polymer to allow to increase the length.

According to at least one embodiment, the rotor, or part of the rotor, and/or the at least one paddle portion is/are of iron or an iron alloy. Otherwise, the rotor may be of a non-metallic material like ferrite, that is, of a ceramic material made by mixing and firing large proportions of iron(III) oxide blended with small proportions of one or more additional metallic elements, such as barium, manganese, nickel, and zinc. Depending on the function of a specific part of the rotor, different materials can be combined in the rotor to simultaneously improve driving and mechanical strength and stirring properties.

According to at least one embodiment, an extent of the rotor and/or of the at least one paddle portion along the axis of rotation is at least 0.1 m or at least 0.2 m or at least 0.4 m. Alternatively or additionally, said extent is at most 5 m or at most 2 m or at most 1 m.

According to at least one embodiment, a diameter of the rotor and/or the at least one paddle portion in a direction perpendicular to the axis of rotation is at least 0.02 m or at least 0.05 m or at least 0.2 m. Alternatively or additionally, said diameter is at most 1 m or at most 0.5 m or at most 0.3 m.

According to at least one embodiment, the extent of the rotor and/or the at least one paddle portion is larger than the diameter of the rotor and/or the at least one paddle portion by at least a factor of 1.2 or by at least a factor of 2 or by at least a factor of 4. Alternatively or additionally, said factor is at most 20 or at most 10 or at most 5.

According to at least one embodiment, the rotor (1) comprises a winded flat bar as the paddle portion. If there is a plurality of paddle portions, each one of the paddle portions can be formed of its own winded flat bar. The at least one winded flat bar is configured to move the liquid. Thus, the winded flat bar may be in direct contact with the liquid. The same may apply to all other example paddle portions.

According to at least one embodiment, the rotor and/or the at least one paddle portion is/are one single piece. Thus, the rotor and/or the at least one paddle portion can be fabricated in an efficient manner and there is no need for any seams or contact faces. Otherwise, the rotor and/or the at least one paddle portion can be composed of a plurality of parts that are connected together.

According to at least one embodiment, the rotor comprises a bore along the axis of rotation. Thus, along the axis of rotation the at least one paddle portion can be free of any solid material. However, the ends of the rotor can be located on the axis of rotation, but the ends could also be formed of rings or the like in order to have the axis of rotation free of any material and in order to improve a flow of liquid along the axis of rotation.

According to at least one embodiment, the stator is electrically driven by means of a directional T interchange, also referred to as WYE. For example, all or at least some of the coils are connected in pairs in an electrically anti-parallel manner Optionally, there is a specific sequence of coils in one half period of the paddle portion, and said sequence is inverted in the next half period of the paddle portion.

'Inverted' can mean that a current direction in the inverted coil is opposite to the current direction in the corresponding coil half a period away. Thus, a number of the specific sequences is equal to a number of the periods comprised by the paddle portion.

For example, per specific sequence, that is, per half period, there may be at least three coils or at least five coils and/or there may be at most 20 coils or at most twelve coils or at most six coils. Hence, a relatively small number of coils is sufficient to drive the rotor.

According to at least one embodiment, the rotor and/or the at least one paddle portion is/are arranged in an upright manner next to the exterior tank wall. Hence, the rotor can be configured to transport the liquid from bottom to top along the exterior tank wall, or from top to bottom. For example, cool oil at the bottom is transported to the top of the tank to counter a gravity-driven temperature gradient in the tank. Thus, a cooling efficiency can be improved by reducing a temperature gradient of the liquid within the tank.

According to at least one embodiment, the tank comprises at least one of a duct and a guide next to the rotor. The at least one duct and/or the at least one guide is/are for leading the liquid in a defined manner There can be one or a plurality of ducts and/or guides per paddle portion.

It is possible that the at least one duct and/or guide is/are arranged in a fixed manner so that the at least one duct and/or guide do(es) not move relative to the rotor and/or relative to the stator. Otherwise, the at least one duct and/or guide can be a movable part.

According to at least one embodiment, the tank accommodates N of the rotors and N is a natural number ≥3. For example, the N rotors are located at different locations inside the exterior tank wall.

According to at least one embodiment, M of the stators are located outside the exterior tank wall, and M is a natural number ≥2 and M<N. Thus, the number of rotors exceeds the number of stators.

According to at least one embodiment, there is a one-to-one assignment between the M stators and M of the rotors, wherein N−M of the rotors are not assigned to one of the stators. Thus, there can be spare rotors in the tank that can be used for cooling in case of a defect of one of the used rotors. Hence, a life span of the liquid circulating system can be increased.

According to at least one embodiment, an axis of rotation of the rotor is perpendicular to the straight line along which the coils are arranged. The rotor may comprise a driving portion and at least one paddle portion. For example, the driving portion is a cylinder around the at least one paddle portion. The driving portion may be a composite of ferritic and non-ferritic materials, for example, in the fashion of a barber pole.

According to at least one embodiment, the rotor is located in a main tank volume of the tank. For example, the rotor is not located in an attached tube system or the like different from the main tank volume. In the main tank volume, the at least one electric component is located. In this context, the at least one duct and/or guide is not necessarily considered to separate the main tank volume from the rotor. This is because the at least one duct and/or guide is not configured to be exposed to an exterior pressure. Therefore, a material thickness of a rube or metal sheet the at least one duct and/or guide is formed from may be at most 5% or at most 10% or at most 30% of the wall thickness of the exterior tank wall. In other words, the at least one duct and/or guide is made from a material significantly thinner than the exterior tank wall.

According to at least one embodiment, the main tank volume is of cuboid shape. Hence, the tank may be a cube or approximately a cube. It is possible that at least one further accessory volume or component, like a transformer turret and/or a fuse case, is attached to the main tank volume. For example, a volume of each of such at least one accessory volume amounts to at most 5% or at most 10% of the main tank volume. The at least one accessory volume is, for example, a cylinder or a cone or a truncated cone or also a small cube.

According to at least one embodiment, the rotor has a rotor cross-sectional area which is defined by the area the rotor crosses during rotating, seen in parallel with the axis of rotation. A minimum cross-sectional area between the rotor and the at least one electric component is at least 1.5 times or at least twice or thrice the rotor cross-sectional area. Contrary to that, if the rotor is located not in the main tank volume but in a tube system outside the tank, then the rotor cross-sectional area is about the same as a cross-sectional area of the tube system that accommodates the rotor. Hence, by means of the rotor located in the main tank volume, large-scale movement of the liquid in the tank can be ensured.

According to at least one embodiment, there is a line-of-sight between the at least one electric component and the rotor. In other words, there are no further components of the tank between the respective electric component and the assigned rotor, disregarding the liquid. It is possible that there are lines-of-sight from only part of the rotor to the respective electric component, or all of the rotor can be seen from the respective electric component.

According to at least one embodiment, the rotor faces the electric component. Hence, there is no exterior tank wall between the rotor and the electric component. This does not necessarily exclude that there are any ducts and/or guides, however, preferably there are no ducts and/or guides between the rotor and the at least one electric component. Moreover, it is possible that only the liquid is located between the rotor and the electric component, and no solid material not belonging to the rotor or to the at least one electric component.

Further, an operating method is provided. The method uses a liquid circulating system as indicated in connection with at least one of the above-stated embodiments. Features of the liquid circulating system are therefore also disclosed for the operating method and vice versa.

In at least one embodiment, the method is to operate the liquid circulation system, and the method comprises:
applying the stator onto the exterior tank wall next to the rotor,
powering the stator so that the stator drives the varying electromagnetic field,
rotating the rotor by means of the varying electromagnetic field driven in the touchless manner through the exterior tank wall so that the liquid is circulated within the tank.

A tank, a power unit, a liquid circulation system and an operating method described herein are explained in greater detail below by way of example embodiments with reference to the drawings. Elements which are the same in the individual figures are indicated with the same reference numerals. The relationships between the elements are not shown to scale, however, but instead individual elements may be shown exaggeratedly large to assist understanding.

In the figures:

FIG. 1 is a schematic representation of an example embodiment of an operating method using a tank and a stator described herein, illustrated in a sectional view, FIG. 2 is a schematic representation of an example embodiment of a circuit diagram for power units described herein, FIGS. 3 to 6 are schematic sectional views of example embodiments of liquid circulation systems described herein, and FIGS. 7 to 13 are schematic perspective views of example embodiments of rotors for tanks described herein.

FIG. 1 illustrates an example embodiment of an operating method of a liquid circulation system 100. The liquid circulation system 100 comprises a tank 3 in which an electric component 31 is located. The only very schematically drawn at least one electric component 31 is, for example, a transformer, a drive, or a shunt reactor. Further, there is a rotor 1 in the tank. The rotor 1 is of a ferritic material like iron or an iron-chromium alloy. The rotor 1 is configured to circulate a liquid 4 in the tank 3 to provide improved cooling for the at least one electric component 31. For example, the liquid 4 is transformer oil.

The tank 4 is configured to be placed in water, for example, in salt water, so that the tank 3 could be a sub-sea tank. Hence, a wall thickness of an exterior tank wall 30 is comparably large and may be at least 5 mm. For example, the wall thickness is 10 mm. The exterior tank wall 30 at which the rotor 1 is located is of a non-magnetic material like stainless steel. The rotor 1 is located as close as possible to the exterior tank wall 30 without touching the exterior tank wall 30 in the intended use.

Outside the tank 3, next to the exterior tank wall 30 at the rotor 1, there is a stator 22. The stator 22 and the rotor 1 are arranged in parallel with each other and in parallel with a portion of the exterior tank wall 30 next to the rotor 1 and to the stator 22. Hence, an axis R of rotation of the rotor 1 is also in parallel with said portion of the exterior tank wall 30. Optional supports of the rotor 1 to define a position of the axis R are not shown in FIG. 1.

The stator 22 comprises a plurality of coils 23. The coils 23 can be arranged at teeth of a common soft iron core 25. For better understanding, in FIG. 1 the coils 23 are drawn beyond the soft iron core 25 to improve illustration of the electric wiring.

The coils 23 may be arranged in groups, wherein each group may be assigned to a half winding H of a paddle portion 12 of the rotor 1, the paddle portion 12 being that part of the rotor 1 that is configured to circulate the liquid 4. The number of coils 23 per half winding H is, for example, at least two or at least three and/or at most ten or at most six. In the specific example of FIG. 1, said number is three, without limiting the concept of the rotor to said number. The explanations of the mode of operation in the following are for three coils 23 per half period H, but of course apply to other numbers, too.

The groups of coils 23 may directly follow one another. For example, a distance between the coils 23 is the same all along the stator 22, but otherwise the coils 23 may be arranged closer to one another within the respective groups. A 'normal' group is followed by an 'inverted' group which is again followed by a 'normal' group and so on all along the rotor 1. In the 'inverted' groups, a magnetic field M is inverted compared with the 'normal' groups. For example, when specific coils in the 'normal' groups have a magnetic south pole on a side facing the exterior tank wall 30, the corresponding specific coils in the 'inverted' groups have a magnetic north pole on their side facing the exterior tank wall 30, and vice versa.

It is possible that per group, that is, per 'inverted' group and per 'normal' group, at each point of time only one of the coils 23 is energized. This means that in each group at the same time only the i-th coil is provided with a current, wherein the coils 23 in the groups are consecutively numbered with the index i. For example, if i=2, only the second coils 23 in all the groups are energized so that the second coils 23 provide an alternating line of magnetic south poles and north poles, and all other coils with i≠2 are not energized at those times. After the i-th coils have been energized, the i+1-th coils are energized until the last coils in the groups have been energized so that the scheme can start with i=1 again. By means of this driving scheme, a travelling magnetic wave is generated that moves the rotor 1.

Hence, the helical ferritic rotor 1 has an axle and a bearing on its centerline to allow it to rotate freely. The stator 22 has its concentrated coils 23 on the teeth of the soft iron core 25. The coils 23 and the respective teeth, in the specific example of having three coils 23 per group and per half winding H, are labeled with A, B, C, ¬A, ¬B, ¬C and so on. A length of the stator 22 and of the rotor 1 can be adjusted to fit this, but should at least be one complete twist or winding of the rotor 1, corresponding to six teeth of the stator 22 in this specific example.

A magnetic flux of the magnetic field M is illustrated when the coils A and ¬A are energized, thus attracting rotor lobes of the paddle portion 12 as shown, with a magnetic circuit completed in the stator 22. In FIG. 2, an example circuitry 6 for an electronic commutator with the switching sequence A, B, C, ¬A, ¬B, ¬C is illustrated for a WYE connected stator 22 as show in FIG. 1. The circuitry 6 comprises DC current sources 61A and 61B, switches 62, capacitors 63, and a common contact 65.

In operation, the switching sequence is fed into the commutating switches, which cause the rotor 1 to spin, such that the top of the rotor 1 is coming towards the observer of FIG. 1. In FIG. 1, the rotor 1 is shown as a dashed line as rotor 1' at a later time after a 180° turn around the axis R of rotation.

By reversing the switching sequence, the direction of rotation can be reversed if desired. Not shown in the diagram is a logic that generates the switching sequence nor a split power supply required by the WYE connected stator 22. Alternatively, the stator 22 can be connected as an electric DELTA and would not require a dual power supply, though the commutating logic would be different, requiring two switches to be on at the same time.

For example, the length of the paddle portion 12 along the axis R of the rotor 1 is between 0.5 m and 1.5 m inclusive, and a diameter of the paddle portion 12 perpendicular to the axis R is between 0.1 m and 0.4 m inclusive. The coils 23 may be configured for a current of at least 0.1 A and/or of at most 100 A.

For example, the rotor 1 rotates relatively slowly. Thus, a rotation frequency may be at least 10 rpm and/or at most 120 rpm, where rpm means rounds per minute. The liquid 4, that is, the transformer oil to be circulated, may have a temperature of 60° C. to 90° C. at a hot side, that is, near the electric device 31, and may have a temperature of about 4° C. at a cool side at the exterior tank wall 30, so that there may be a relatively stable intrinsic thermal layering that can be ruptured by means of the rotor 1 together with the stator 22.

In the example embodiment of FIG. 3, the tank 3 is placed in sea water 7 at a depth of, for example, at least 0.1 km and at most 3 km. The electric component 31 and the rotor 1 are located in a same common main tank volume which is, for example, of cuboid shape.

The stator 22 is included in a power unit 2. The power unit 2 is a module attached from outside to the exterior tank wall 30 next to the rotor 1. Thus, in case of malfunction, the power unit 2 may be relatively easily replaced with a spare part. To make the power unit 2 an essentially independent module, the power unit 2 may include a control unit 21 to drive the coils 23 and may comprise an electric terminal box 24 to be provided with an electrical power connection by a wiring 26.

Accordingly, part of the liquid circulation system 100 is located inside the tank 3 and part of the liquid circulation system 100 is located outside the tank 3. Because the rotor 1 is free of any electronics or active components, the rotor 1 itself is comparably insensitive, and the more sensitive stator 22 can easily be replaced because of using the modular power unit 2.

Moreover, in FIG. 3 it is illustrated that the rotor 1 is supported on its ends 11 directly at portions of the exterior tank wall 30 not in parallel with the axis R of rotation.

The rotor 1 may be arranged in an upright manner so that the axis R of rotation can be oriented vertically or approximately vertically. Hence, cool liquid 4 can be pumped from the bottom to top of tank 3 to improve cooling of the electric component 31.

Otherwise, the same as for FIGS. 1 and 2 applies for FIG. 3.

According to FIG. 4, the tank 3 with the electric component 31 is located atop a further electric device 8. For example, in this configuration the electric component 31 is a transformer and the further electric device 8 is a variable speed drive. Other than shown, the electric component 31 and the further electric device 8 may be located in the same tank 3 and not in separate tanks 3. The same applies to all other example embodiments.

Moreover, the tank 3 may completely be filled with the electric component 31 and/or the further electric device 8 together with the liquid 4 so that the tank 3 can be placed at deep sea level without significant deformation.

As an option, ends 11 of the at least one rotor 1 can be configured as supports for the paddle portion 12 of the rotor 1. The ends 11 may be bearings mounted to the exterior tank wall 30.

Otherwise, the same as for FIGS. 1 to 3 applies for FIG. 4.

According to FIG. 5, there is a plurality of the stators 22 that optionally are arranged in the power units 2. Each one of the stators 22 is assigned to one of the plurality of rotors 1. The same can apply to all other example embodiments.

As an option, there is at least one spare rotor 1 in the tank 3. This spare rotor 1 can be used if one of the other rotors 1 is defective so that a cooling capability of the liquid circulation system 100 can be kept high even in the case of partial failure. The same can apply to all other example embodiments.

As a further option, there can be one or a plurality of ducts 52 assigned, for example, in a one-to-one manner to the rotors 1. In the example of FIG. 5, the axes R of rotation are perpendicular to the plane of the drawing. Accordingly, the axes R and the ducts 52 may be arranged in a horizontal manner.

Otherwise, the same as for FIGS. 1 to 4 applies for FIG. 5.

According to FIG. 6, there can be a plurality of the power units 2 and of the rotors 1, and there can be a combination of horizontally and of vertically arranged rotors 1. It is possible that the rotors 1 are located at various exterior tank walls 30. The same can apply to all other example embodiments.

Moreover, alternatively or additionally to the ducts 52 of FIG. 5, there can be one or a plurality of guides 51 next to the rotors 1 or between adjacent rotors 1 to better define the circulation of the liquid 4. This applies to all other example embodiments, too.

Otherwise, the same as for FIGS. 1 to 5 applies for FIG. 6.

In FIGS. 7 to 11, some examples of the paddle portions 12 of the rotors 1 are illustrated. These examples could be used in all the example embodiments of the tank 3 and of the liquid circulation system 100. In these embodiments, the paddle portions 12 are at the same time driving portions 14 of the rotor 1 to drive the rotor 1 by means of the stator.

Figure 7:
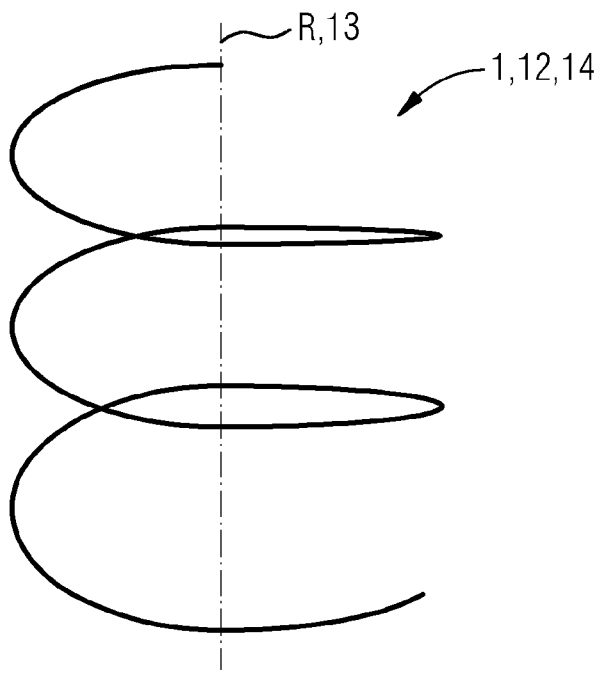

According to FIG. 7, the paddle portion 12 is a single helix. For example, contrary to what is illustrated in FIG. 7, a lead between two consecutive windings of the helix along the axis R of rotation exceeds the diameter of the paddle portion 12 by at least a factor of 1.5 or by at least a factor of 3 and/or by at most a factor of 10.

Along the axis R of rotation, there is a bore 13 free of any material of the rotor 1. Such a bore 13 could also be present in all the other example embodiments.

Figure 8:
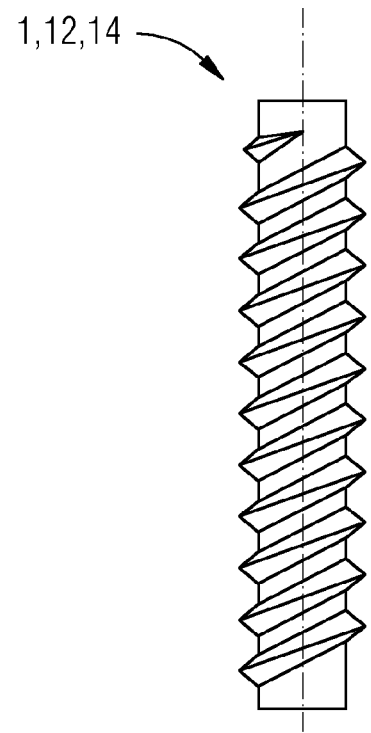

In the example embodiment of FIG. 8, the paddle portion 12 is shaped like a screw. Contrary to what is shown, the thread part could have a bucket-like or coop-like shape.

Figure 9:
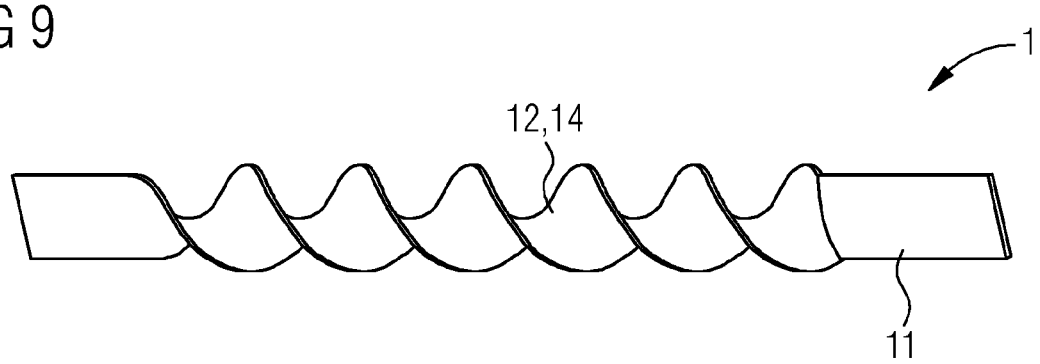

According to FIG. 9, the paddle portion 12 is formed of a flat iron that has been drilled. Hence, the ends 11 can still be of flat shape and may easily be fastened to a bearing.

Figure 10:
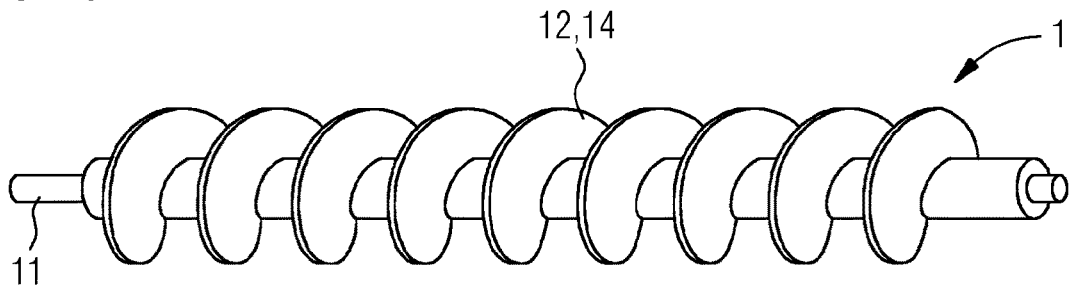

According to FIG. 10, the paddle portion 12 has the shape of an Archimedean screw. Thus, the thread of the screw accounts for, for example, at least 50% or at least 70% of a diameter of the paddle portion 12.

Figure 11:
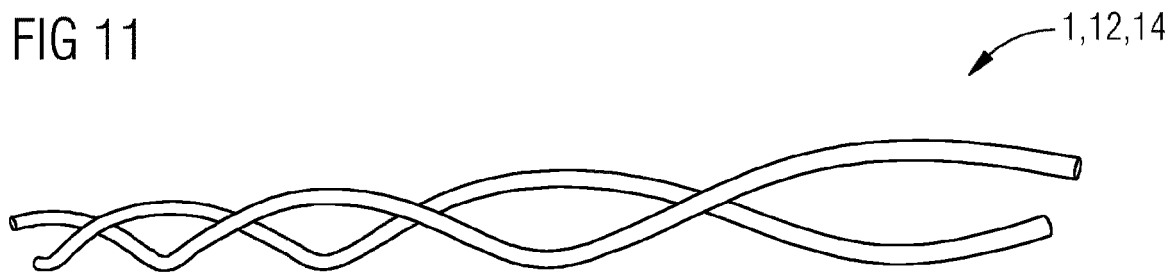

In FIG. 11, the paddle portion 12 could not only be of one single piece as in FIGS. 7 to 10, but also multi-piece arrangements are possible. For example, the paddle portion 12 is composed of two helices that engage each other, but may be distant from one another.

Figure 12:
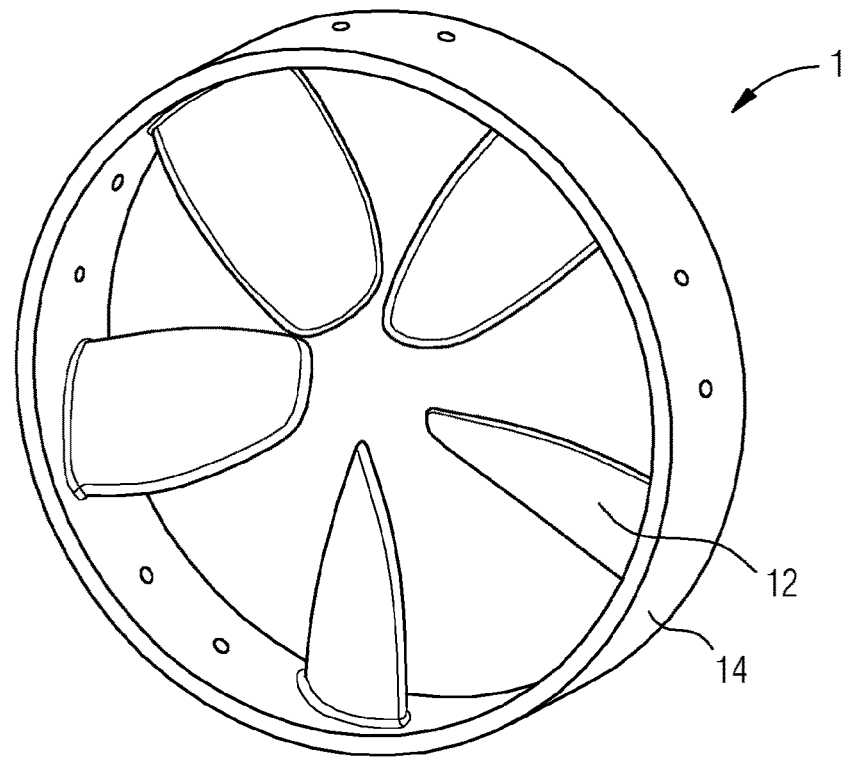

In the example embodiment of FIG. 12, the axis R of rotation of the rotor 1 is configured to be in parallel with the tank wall, but perpendicular to the straight line along which the coils are arranged. For example, a ferritic helical ridge can be on the outside of a hollow non-magnetic cylinder where there are impeller blades inside. This cylinder can have a large diameter and more efficient pumping action. This concept may referred to as rim driven ducted fan concept. Thus, the rotor can comprise the paddle portions 12 with the blades and a cylindrical driving portion 14 around the blades. For example, a diameter of the driving portion 14 and, thus, of the rotor 1 exceeds a length of the rotor 1 along the axis of rotation.

Figure 13:
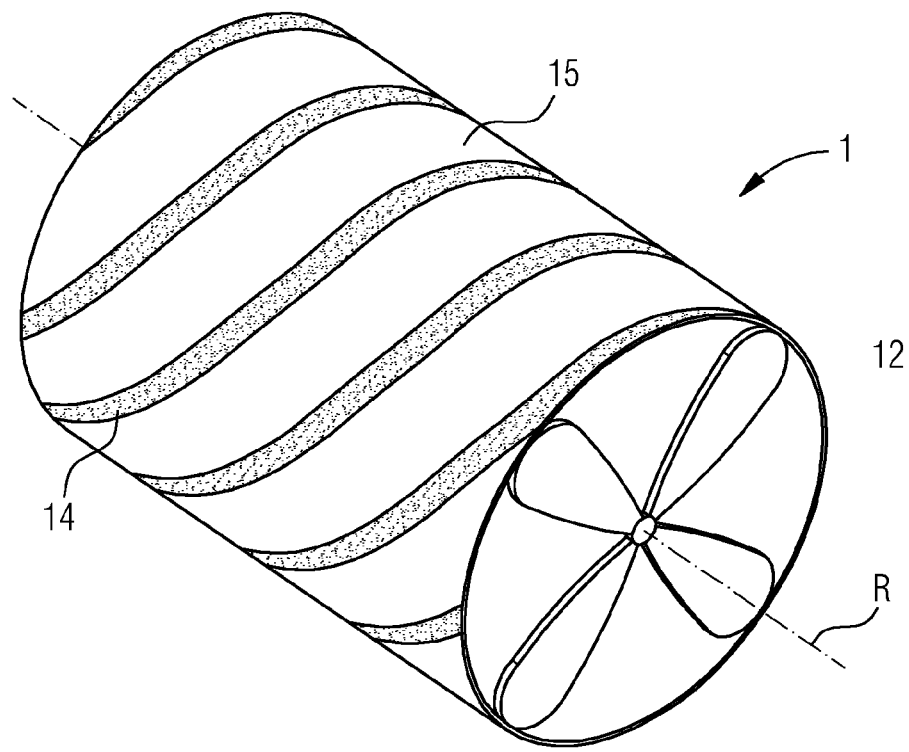

In the example embodiment of FIG. 13, the length of the rotor 1 along the axis R of rotation may be larger than a diameter of the rotor 1. Again, the paddle portions 12 are internal impellers fixed to a cladding 15 that is shaped as a cylinder wall. The cladding 15 is of a non-magnetic material. The driving portion 14 is composed of ferritic strips in a helical pattern. Accordingly, the cylinder composed of the cladding 15 and of the driving portion 14 may be configured like a barber pole.

Both in FIGS. 12 and 13 the stator configured for the shown rotors 1 may be a linear stator, that is, like in all other example embodiments, the coils of the respective stator can be arranged along a straight line, for example, in an equidistant manner. Further, as an option, the paddle portion 12 can be of a different material than the driving portion 14.

Otherwise, the same as for FIGS. 7 to 11 applies for FIGS. 12 and 13.

The invention described here is not restricted by the description given with reference to the example embodiments. Rather, the invention encompasses any novel feature and any combination of features, including in particular any combination of features in the claims, even if this feature or this combination is not itself explicitly indicated in the claims or example embodiments.

This patent application claims the priority of European patent application 20209190.6, the disclosure content of which is hereby incorporated by reference.

LIST OF REFERENCE SIGNS 1 ferritic rotor
11 pivoted end of the rotor
12 paddle portion of the rotor
13 bore
14 driving portion
15 cladding
2 power unit
21 control unit
22 stator
23 coil
24 electric terminal box
25 soft iron core
26 wiring
3 tank
30 non-magnetic exterior tank wall
31 electric component
4 liquid
51 guide
52 duct
6 circuitry
61A first DC current source
61B second DC current source
62 switch
63 capacitor
65 common contact
7 sea water
8 further electric device
100 liquid circulation system
A . . . C coils of the stator
H half winding
M magnetic field
R axis of rotation of the rotor

The invention claimed is:

1. A liquid circulation system comprising:
a rotor located within a tank,
an electric component accommodated within the tank,
a power unit comprising a stator having a plurality of coils, a control unit and an electric terminal box, the power unit is attached outside the tank, and
an exterior tank wall of the tank that is non-magnetic and that is located next to the rotor and to the stator between the rotor and the stator, the power unit is attached on the exterior tank wall,
wherein
the tank is configured as a sub-sea component,
the rotor faces the electric component so that there is no exterior tank wall between the rotor and the electric component,
an axis (R) of rotation of the rotor is in parallel with the exterior tank wall next to the rotor,
the rotor is configured to be rotated by the stator through the exterior tank wall by means of a varying electromagnetic field driven by the stator to circulate a liquid within the tank and a paddle portion of the rotor is configured to rotate around the axis (R) of rotation is distant from the exterior tank wall,
the coils of the stator are arranged along the axis (R) of rotation of the rotor so that the coils are arranged in a linear manner along a straight line, and
at least a driving portion of the rotor is of helical shape.

2. The liquid circulation system of claim 1,
wherein the electric component and the rotor are located in a common main tank volume.

3. The liquid circulation system of claim 1,
which is configured to be put into saltwater up to a depth of 1 km or 2 km or 3 km or 5 km.

4. The liquid circulation system of claim 1,
wherein the tank is filled with the liquid and the liquid is transformer oil.

5. The liquid circulation system of claim 1,
wherein the power unit is reversibly attachable to the exterior tank wall, and
wherein a distance between the paddle portion and the exterior tank wall next to the rotor is at least 1 mm and is at most 0.01 m.

6. The liquid circulation system of claim 1,
wherein the tank accommodates at least one of a transformer, a drive and a shunt reactor as the electric component, and
wherein the exterior tank wall is made of steel and has a thickness of between 0.5 cm and 3 cm inclusive.

7. The liquid circulation system of claim 1,
wherein ends of the rotor that bear the paddle portion are supported in a fixed manner so that the ends have a fixed location relative to the exterior tank wall next to the rotor.

8. The liquid circulation system of claim 1,
wherein a length of the paddle portion along the axis (R) of rotation is between 1.5 and 15 windings of the helix.

9. The liquid circulation system of claim 1,
wherein the rotor is of iron or an iron alloy,
wherein an extent of the rotor along the axis (R) of rotation is at least 0.2 m and at most 2 m, and
wherein a diameter of the rotor in a direction perpendicular to the axis (R) of rotation is at least 0.05 m and at most 0.5 m, the extent being larger than the diameter by at least a factor of 2.

10. The liquid circulation system of claim 1,
wherein the rotor comprises a winded flat bar configured to move the liquid, and
wherein the rotor is one single piece.

11. The liquid circulation system of claim 1,
wherein the stator is electrically driven by means of a directional T interchange, and
wherein at least some of the coils are connected in pairs in an anti-parallel manner.

12. The liquid circulation system of claim 1,
wherein the rotor is arranged in an upright manner next to the exterior tank wall so that the axis (R) of rotation is oriented vertically and so that the rotor is configured to transport the liquid from bottom to top along the exterior tank wall.

13. The liquid circulation system of claim 1,
wherein the tank comprises at least one of a duct and a guide next to the rotor and within the tank for leading the liquid.

14. The liquid circulation system of claim 1,
wherein the tank accommodates N of the rotors and N is a natural number ≥3, the N rotors are located at different locations inside the exterior tank wall,
wherein M of the stators are located outside the exterior tank wall, M is a natural number ≥2 and M<N, and
wherein there is a one-to-one assignment between the M stators and M of the rotors, and N−M of the rotors are not assigned to one of the stators.

15. A method to operate a liquid circulation system of claim 1, the method comprising:
applying the stator onto the exterior tank wall next to the rotor,
powering the stator so that the stator drives the varying electromagnetic field,
rotating the rotor by means of the varying electromagnetic field driven in the touchless manner through the exterior tank wall so that the liquid is circulated within the tank.

* * * * *